United States Patent
Kanai et al.

(10) Patent No.: US 12,469,762 B2
(45) Date of Patent: Nov. 11, 2025

(54) SEMICONDUCTOR DEVICE AND MANUFACTURING METHOD THEREFOR

(71) Applicant: FUJI ELECTRIC CO., LTD., Kawasaki (JP)

(72) Inventors: Naoyuki Kanai, Matsumoto (JP); Shun Okada, Kawasaki (JP); Ryoichi Kato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 533 days.

(21) Appl. No.: 17/825,520

(22) Filed: May 26, 2022

(65) Prior Publication Data

US 2022/0415749 A1 Dec. 29, 2022

(30) Foreign Application Priority Data

Jun. 25, 2021 (JP) .................................. 2021-105765

(51) Int. Cl.
*H01L 23/04* (2006.01)
*H01L 23/24* (2006.01)
(Continued)

(52) U.S. Cl.
CPC ........ *H01L 23/3675* (2013.01); *H01L 23/485* (2013.01)

(58) Field of Classification Search
CPC ..... H01L 23/3675; H01L 24/01; H01L 24/63; H01L 24/04; H01L 24/07; H01L 25/10; H01L 2225/1011; H01L 23/485
See application file for complete search history.

(56) References Cited

U.S. PATENT DOCUMENTS

| | | | |
|---|---|---|---|
| 2008/0217760 A1* | 9/2008 | Yoshihara | H01L 23/49861 438/122 |
| 2016/0155687 A1* | 6/2016 | Takizawa | H01L 21/4842 438/123 |

(Continued)

FOREIGN PATENT DOCUMENTS

| | | |
|---|---|---|
| JP | H09260441 A | 10/1997 |
| JP | 2004-039807 A | 2/2004 |

(Continued)

OTHER PUBLICATIONS

Preeti S. Chauhan et al., "Copper Wire Bonding", Springer, New York, 2014 (Year: 2014).*

(Continued)

*Primary Examiner* — Dale E Page
*Assistant Examiner* — Cristian A Tivarus
(74) *Attorney, Agent, or Firm* — Rabin & Berdo, P.C.

(57) ABSTRACT

A semiconductor device includes a baseplate and a case which includes an external wall surrounding an internal space and a dividing wall extending in a first direction and separating the space into compartments. The dividing wall has a lower end fixed to the principal surface and includes, on a sidewall, a terrace positioned further away from the principal surface than the lower end and hanging out toward the space compared to the lower end in a second direction parallel to the principal surface and perpendicular to the first direction. A terminal's bonding part, to which a wire is bonded, is disposed on the terrace. A ratio of the wire's diameter to the bonding part's width in the first direction is set to ≤0.15, which prevents a situation where bonding power is not sufficiently applied to the bonding part during ultrasonic bonding of the wire, thus increasing the bonding strength.

8 Claims, 9 Drawing Sheets

(51) Int. Cl.
*H01L 23/367* (2006.01)
*H01L 23/485* (2006.01)

(56) References Cited

U.S. PATENT DOCUMENTS

2020/0161145 A1* 5/2020 Mafune ................ H02M 7/003
2020/0286840 A1 9/2020 Kaji et al.

FOREIGN PATENT DOCUMENTS

| JP | 2006-066427 A | 3/2006 |
| JP | 2012-204366 A | 10/2012 |
| WO | 2011132670 A1 | 10/2011 |
| WO | 2019008828 A1 | 1/2019 |

OTHER PUBLICATIONS

Japanese Office Action dated Jan. 7, 2025, in the counterpart Japanese Patent Application No. 2021-105765.

* cited by examiner

SEMICONDUCTOR DEVICE AND MANUFACTURING METHOD THEREFOR

CROSS-REFERENCE TO RELATED APPLICATION

This application is based upon and claims the benefit of priority of the prior Japanese Patent Application No. 2021-105765, filed on Jun. 25, 2021, the entire contents of which are incorporated herein by reference.

BACKGROUND OF THE INVENTION

1. Field of the Invention

The embodiments discussed herein relate to a semiconductor device and manufacturing method therefor.

2. Background of the Related Art

There is a known semiconductor device in which a circuit board with a semiconductor element mounted thereon is placed on a baseplate with heat dissipation capability; a case member with space surrounding the circuit board is installed; and the space is divided by a partition plate into a region with the circuit board installed therein and a different region, each of which is individually encapsulated with sealant resin. Disclosed technologies in association with this semiconductor device include connecting the circuit board and the semiconductor element to terminals on the case member and the partition plate by wires, and providing tapered recesses where the case member and the partition plate adhere to the baseplate and forming fillets of the sealant resin penetrating into the recesses.

There is another known semiconductor device where a case is fixed onto a heat dissipation plate with a pair of insulating boards soldered thereto, on each of which a semiconductor element is mounted. The case surrounds the semiconductor elements and the paired insulating boards and includes a beam located between the insulating boards. The beam is provided with a jack-up structure for applying pressing force to the heat dissipation plate. Disclosed technologies in association with this semiconductor device include inserting terminals into the beam, and connecting the insulating boards and the semiconductor elements to terminals on the case and the beam by wires.

In addition, there is a known semiconductor power module where, in an internal space of a resin case provided on a heat dissipation plate such as to surround an insulating board formed on the heat dissipation plate and semiconductor elements mounted on circuit patterns on the insulating board, a beam member is arranged which is integrally formed with an electrode plate spaced with a predetermined distance from the heat dissipation plate, and the electrode plate of the beam member is connected to a semiconductor element by a wire. Disclosed technologies in association with this semiconductor power module include providing a hinge portion for the electrode plate in order to ensure stable bonding of the beam member to the electrode plate.

Japanese Laid-open Patent Publication No. 2012-204366
Japanese Laid-open Patent Publication No. 2006-66427
Japanese Laid-open Patent Publication No. 2004-39807

As for a semiconductor device where a resin case with an external wall surrounding an internal space and a dividing wall separating the internal space into multiple compartments is positioned on a principal surface of a baseplate, and wires are bonded to terminals disposed on the dividing wall, there is sometimes the problem of failing to provide sufficient bonding strength between the terminals and the wires depending on the configurations of the terminals and the dividing wall on which the terminals are disposed. For example, in a configuration where a terrace part hanging out toward the internal space is provided on the dividing wall with a recess formed at a junction with the baseplate, into which sealant penetrates, and each terminal is installed such that a wire bonding part of the terminal is disposed on the terrace part, sufficient wire bonding power may fail to be applied to the bonding part primarily due to the shape of the dividing wall. Insufficient application of power during wire bonding leads to decreased bonding strength between the wire and the bonding part of the terminal, which is likely to cause quality loss and decreased reliability of the semiconductor device.

SUMMARY OF THE INVENTION

According to an aspect, there is provided a semiconductor device including a baseplate having a principal surface; a resin case including an external wall surrounding an internal space and a dividing wall extending in a first direction and separating the internal space into a plurality of compartments, the dividing wall having a lower end which is fixed to the principal surface via an adhesive and including a terrace part provided on a sidewall thereof at a position further away from the principal surface than is a position of the lower end and extending toward the internal space than is the lower end in a second direction parallel to the principal surface and perpendicular to the first direction; a terminal including a bonding part disposed on the terrace part; and a wire bonded to the bonding part, wherein: the wire has a diameter that is at most 0.15 of a width of the bonding part in the first direction.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

(a) First Embodiment

Figure 1:
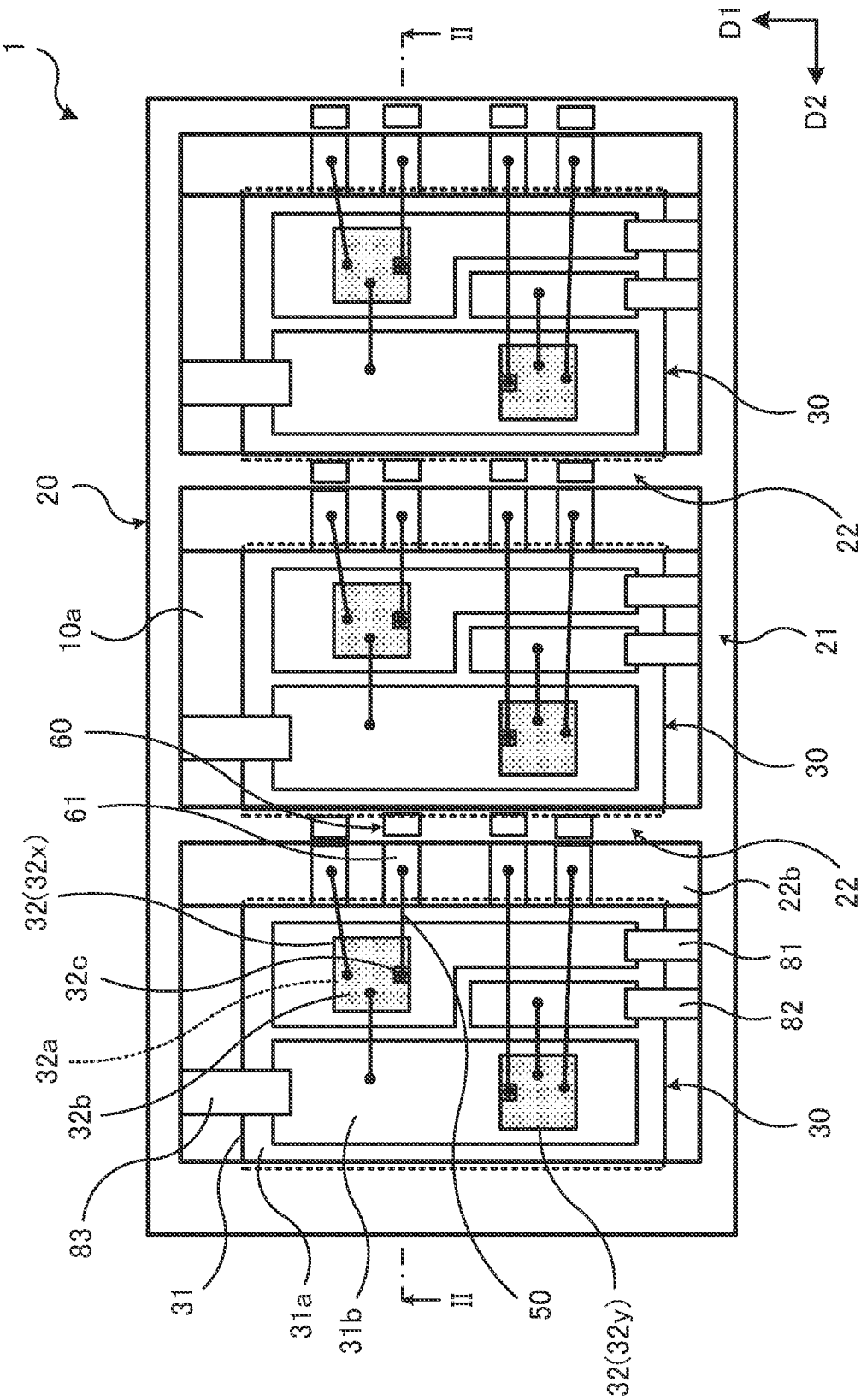
FIG. 1 is a first diagram illustrating an example of a semiconductor device according to a first embodiment.
Figure 2:
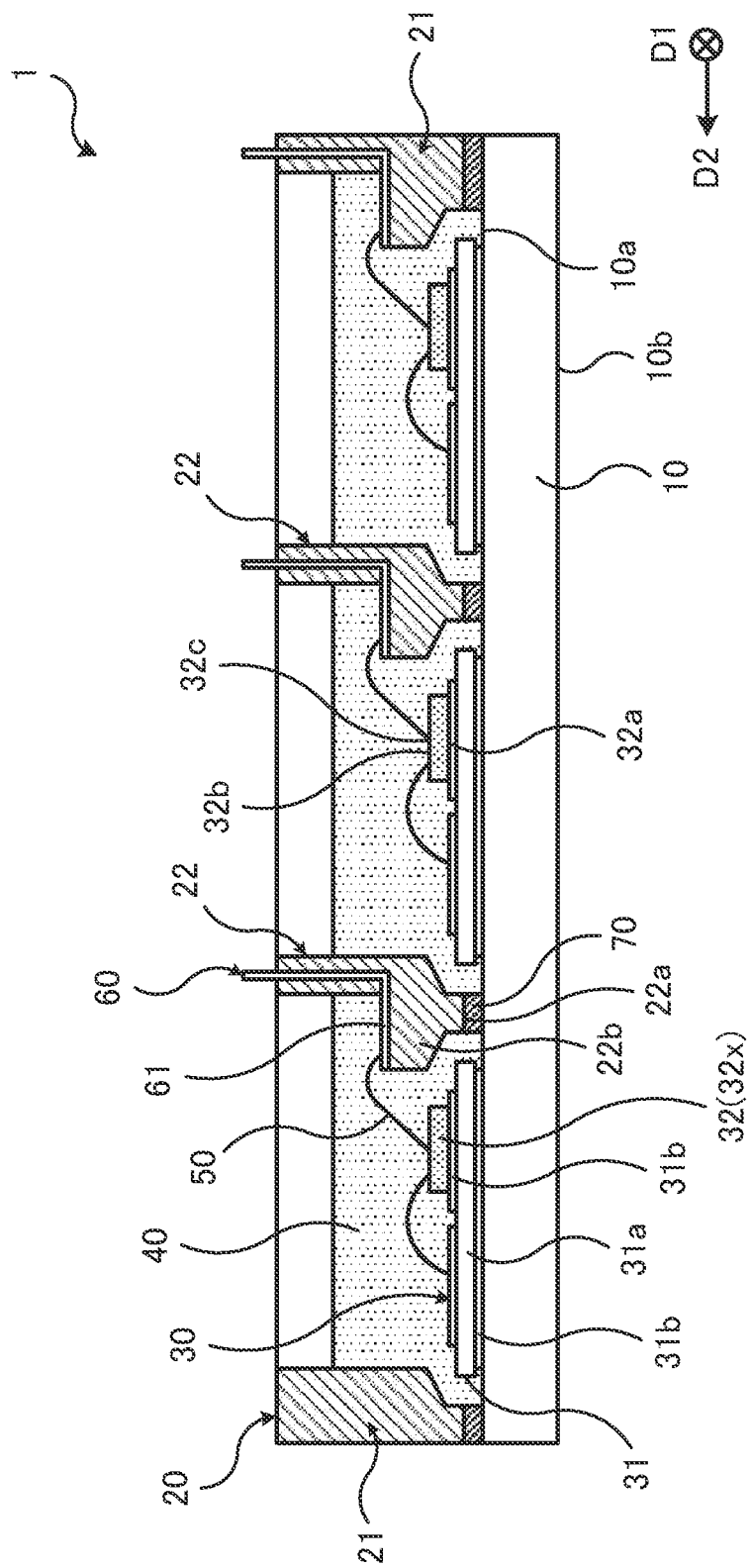
FIG. 2 is a second diagram illustrating the example of the semiconductor device according to the first embodiment.

FIGS. 1 and 2 illustrate an example of a semiconductor device according to a first embodiment. FIG. 1 is a schematic plan view of the example of the semiconductor device, and FIG. 2 is a schematic cross-sectional view of the semiconductor device along line II-II of FIG. 1. Note that FIG. 1 omits sealant depicted in FIG. 2.

A semiconductor device 1 of FIGS. 1 and 2 includes a baseplate 10, a resin case 20, an electronic component 30, and sealant 40. Note that FIG. 1 provides no illustration of the sealant 40.

As the baseplate 10, a metal plate made of, for example, copper (Cu) is used. The resin case 20 is positioned on a first principal surface 10a of the baseplate 10. The resin case 20 is made of, for example, a poly phenylene sulfide (PPS) resin or urethane resin. As depicted in FIGS. 1 and 2, the resin case 20 includes an external wall 21 surrounding its internal space and dividing walls 22 extending in a direction D1 and dividing the internal space into multiple compartments (three compartments illustrated here as an example). In the dividing walls 22 and one side of the external wall 21 parallel to the dividing walls 22, terminals 60 are provided, each of which has a bonding part 61 to which a wire 50 is bonded. The configuration of each dividing wall 22 (and the one side of the external wall 21) of the resin case 20, in which the terminals 60 are installed, and bonding between the bonding part 61 of each terminal 60 and the wire 50 are described in detail later on. As for the resin case 20, the lower ends of the external wall 21 and the dividing walls 22 are fixedly attached to the principal surface 10a of the baseplate 10 via an adhesive 70.

Although no illustration is given here, the semiconductor device 1 may be provided with a lid on the resin case 20 fixed on the principal surface 10a of the baseplate 10, to cover the internal space of the resin case 20. In addition, an air or liquid cooler may be provided directly, or via a thermal interface material or the like, on a principal surface 10b of the baseplate 10 opposite to the principal surface 10a with the resin case 20 fixed thereto.

In the semiconductor device 1, the electronic component 30 is placed in each of the compartments formed on the principal surface 10a of the baseplate 10 by the dividing walls 22 of the resin case 20. Each electronic component 30 used includes, for example, an insulated circuit board 31 and multiple semiconductor elements 32 (two illustrated here as an example) mounted thereon. For example, a direct copper bonding (DCB) substrate, in which a Cu layer 31b in a predetermined pattern is disposed on each side of an insulating board 31a made of alumina ($Al_2O_3$) or the like, is used as the insulated circuit board 31. A different substrate such as an active metal brazed (AMB) substrate may be used instead. Then, the semiconductor elements 32 are individually mounted on the predetermined Cu layers 31b of the cited insulated circuit board 31. As the semiconductor elements 32, semiconductor elements such as insulated gate bipolar transistors (IGBTs) and metal oxide semiconductor field effect transistors (MOSFETs) are used. Into the semiconductor elements 32, diodes such as free wheeling diodes (FWDs) and Schottky barrier diodes (SBDs) are integrated.

Each semiconductor element 32 includes a first load electrode 32a (e.g., a positive electrode) on a first principal surface and a second load electrode 32b (e.g., a negative electrode) and a control electrode 32c on a second principal surface. For example, the first load electrode 32a functions as a collector or drain electrode; the second load electrode 32b as an emitter or source electrode; and the control electrode 32c as a base or gate electrode.

In each compartment, the first load electrodes 32a of the semiconductor elements 32 (32x and 32y) are individually connected, via solder or the like, to a different one of the Cu layers 31b provided on the insulated circuit board 31. The first load electrode 32a of a second semiconductor element 32 (32y) is connected to the Cu layer 31b to which the second load electrode 32b of a first semiconductor element 32 (32x) is connected via a wire, clip, tab or the like (the wire 50 illustrated here as an example). The second load electrode 32b and the control electrode 32c of each semiconductor element 32 are individually connected, via the wires 50, to the bonding parts 61 of the terminals 60 provided on the dividing wall 22 or the external wall 21 of the resin case 20. A first terminal 81 (e.g., a positive terminal) is connected to the Cu layer 31b to which the first load electrode 32a of the first semiconductor element 32 (32x) is connected while a second terminal 82 (e.g., a negative terminal) is connected to the Cu layer 31b to which the second load electrode 32b of the second semiconductor element 32 (32y) is connected. An output terminal 83 is connected to the Cu layer 31b to which the second load electrode 32b of the first semiconductor element 32 (32x) and the first load electrode 32a of the second semiconductor element 32 (32y) are both connected. In this example, a pair of the semiconductor elements 32 (32x and 32y) is connected in series in each of the compartments partitioned by the dividing walls 22 of the resin case 20.

Figure 3:
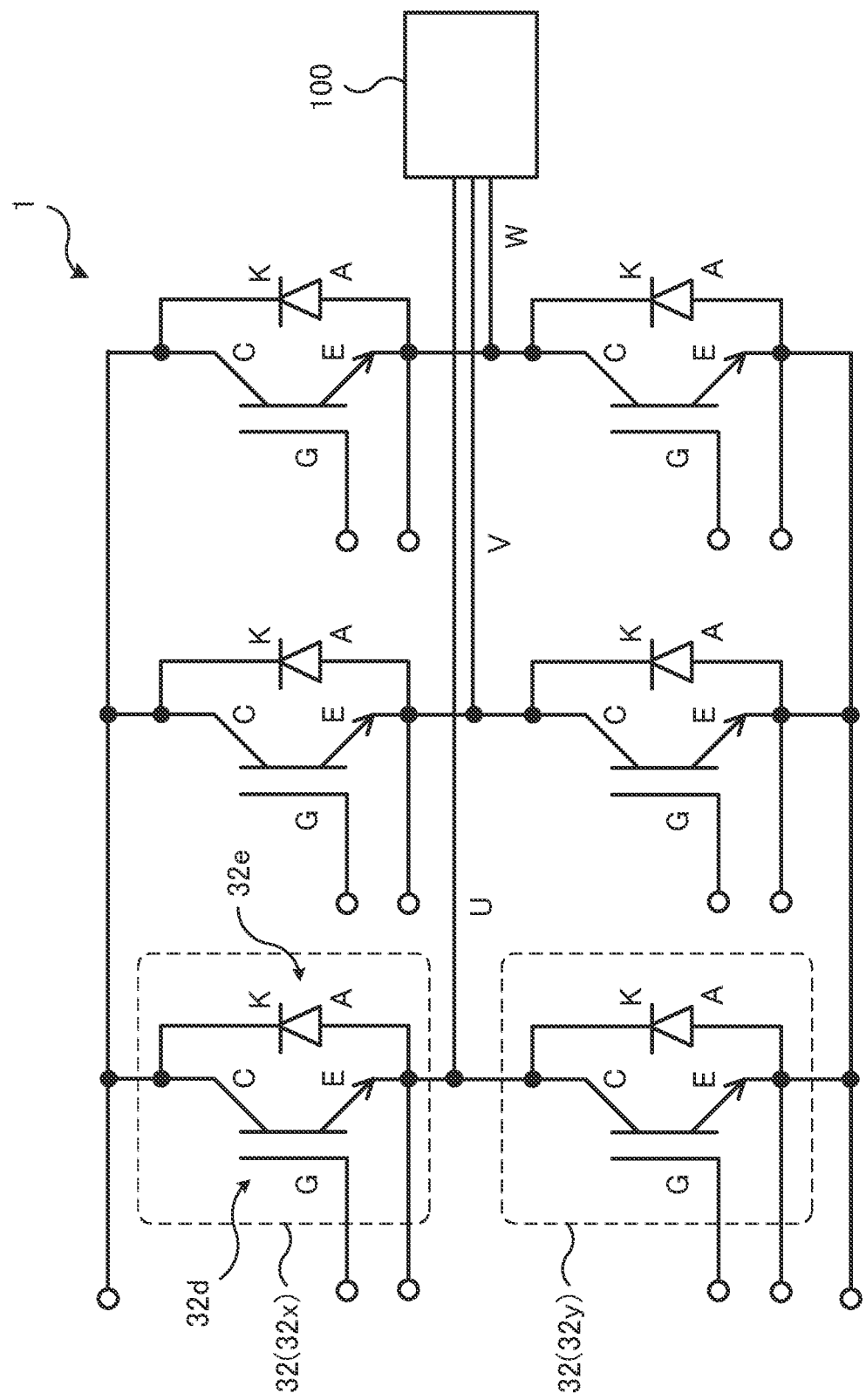
FIG. 3 is a circuit diagram of the example of the semiconductor device according to the first embodiment.

The semiconductor device 1 has, for example, a circuit architecture illustrated in FIG. 3. FIG. 3 is a circuit diagram of the example of the semiconductor device according to the first embodiment.

FIG. 3 illustrates a circuit diagram of the 6-in-1 semiconductor device 1 making up an inverter circuit. In the example of FIG. 3, each of the above-described semiconductor elements 32 is a reverse conducting IGBT (RC-IGBT) into which an IGBT 32d and a FWD 32e are integrated. In the RC-IGBT, a collector electrode C of the IGBT 32d is connected to a cathode electrode K of the FWD 32e while an emitter electrode E of the IGBT 32d is connected to an anode electrode A of the FWD 32e. The first load electrode 32a of each of the aforementioned semiconductor elements 32 corresponds to the collector electrode C of the IGBT 32d; the second load electrode 32b to the emitter electrode E of the IGBT 32d; and the control electrode 32c to a gate electrode G of the IGBT 32d.

In each of the compartments separated by the dividing walls 22 of the resin case 20, the first semiconductor element 32x of the paired semiconductor elements 32 forms an upper arm of one phase while the second semiconductor element 32y forms a lower arm of the phase. Pairs of the semiconductor elements 32, each pair of which is connected in series in a single compartment, are connected in parallel to each other. Connection nodes between the paired semiconductor elements 32 connected in series in the individual compartments, coupled to the output terminals 83, respectively correspond to U phase, V phase, and W phase output nodes, which are connected to a load 100, such as a motor.

In the above example, each of the electronic components 30 disposed in different compartments separated by dividing walls 22 of the resin case 20 includes one semiconductor element 32 forming the upper arm and another semiconductor element 32 forming the lower arm. Note however that this configuration is used merely for the purpose of illustration, and the upper arm of each electronic component may be made up of multiple semiconductor elements 32 connected in series. Similarly, the lower arm of each electronic component 30 may be made up of multiple semiconductor elements 32 connected in series. On the insulated circuit board 31, the Cu layers 31b are formed in a pattern according to the number and layout of the semiconductor elements 32 to be mounted thereon.

In addition, in the semiconductor device 1, the sealant 40 is installed in each compartment separated by dividing walls 22 of the resin case 20 and having the electronic component 30 disposed therein, as illustrated in FIG. 2. The sealant 40 seals, on the principal surface 10a of the baseplate 10, the electronic component 30 disposed in each compartment and the wires 50 or the like connected to the electronic component 30. The sealant 40 is made of, for example, a sealant resin such as an epoxy resin and a phenolic resin or a gel such as a silicone gel. The sealant 40 may include an insulating filler such as silica. The sealant 40 may be made of multiple materials, for example, having a laminated structure in which a silicone gel layer serving as buffer coating is topped with an epoxy sealant resin layer.

The semiconductor device 1 having the above-described configuration is manufactured, for example, by the following method.

First, the baseplate 10 is prepared. Then, the aforementioned resin case 20 is prepared, which includes the external wall 21 surrounding the internal space and the dividing walls 22 extending in the direction D1 and dividing the internal space into multiple compartments. Here, the terminals 60 are provided such that the bonding parts 61 to which the wire 50 is bonded are disposed on the dividing walls 22 as well as on one side of the external wall 21 parallel to the dividing walls 22.

Then, a group of the electronic components 30 is arranged on the principal surface 10a of the prepared baseplate 10. For example, the electronic components 30 are arranged and fixed on the principal surface 10a of the baseplate 10 by sequentially stacking a bonding layer made of solder or the like (not illustrated), the insulated circuit board 31, a bonding layer made of solder or the like (not illustrated), and the semiconductor element 32 at each predetermined position on the principal surface 10a and then applying reflow soldering.

Next, the prepared resin case 20 is positioned on the principal surface 10a of the baseplate 10 with the electronic components 30 mounted thereon. The resin case 20 is disposed on the principal surface 10a of the baseplate 10 by fixing the lower ends of the external wall 21 and the dividing walls 22 to the principal surface 10a via the adhesive 70. The resin case 20 is arranged on the principal surface 10a of the baseplate 10, or the electronic components 30 are preliminarily mounted on the principal surface 10a, such that the electronic components 30 are each placed in a compartment separated by the dividing walls 22 of the resin case 20.

Subsequently, the wires 50 are run between the semiconductor elements 32 and the insulated circuit boards 31 of the electronic components 30 mounted on the principal surface 10a of the baseplate 10 and between the semiconductor elements 32 and the bonding parts 61 of the terminals 60 provided in the dividing walls 22 and the one side of the external wall 21.

Then, the sealant 40 is supplied to each of the compartments separated by the dividing walls 22 of the resin case 20, and as the supplied sealant 40 becomes hardened, the electronic component 30 and the wires 50 and the like in each compartment are sealed together.

Thus, the semiconductor device 1 is manufactured, for example, in the manner described above.

Next described in detail is bonding between the bonding part 61 of the terminal 60 and the wire 50 in the semiconductor device 1 with the above-described configuration.

Figure 4A:
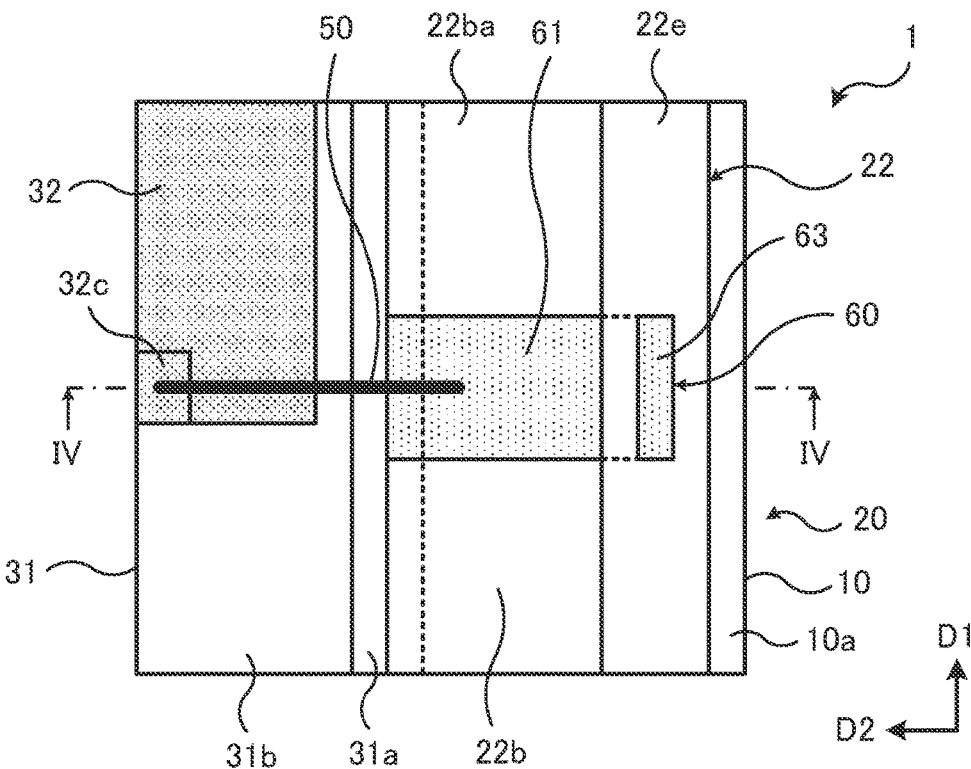
FIGS. 4A and 4B illustrate a configuration example of a wire bonding part of the semiconductor device according to the first embodiment.
Figure 4B:
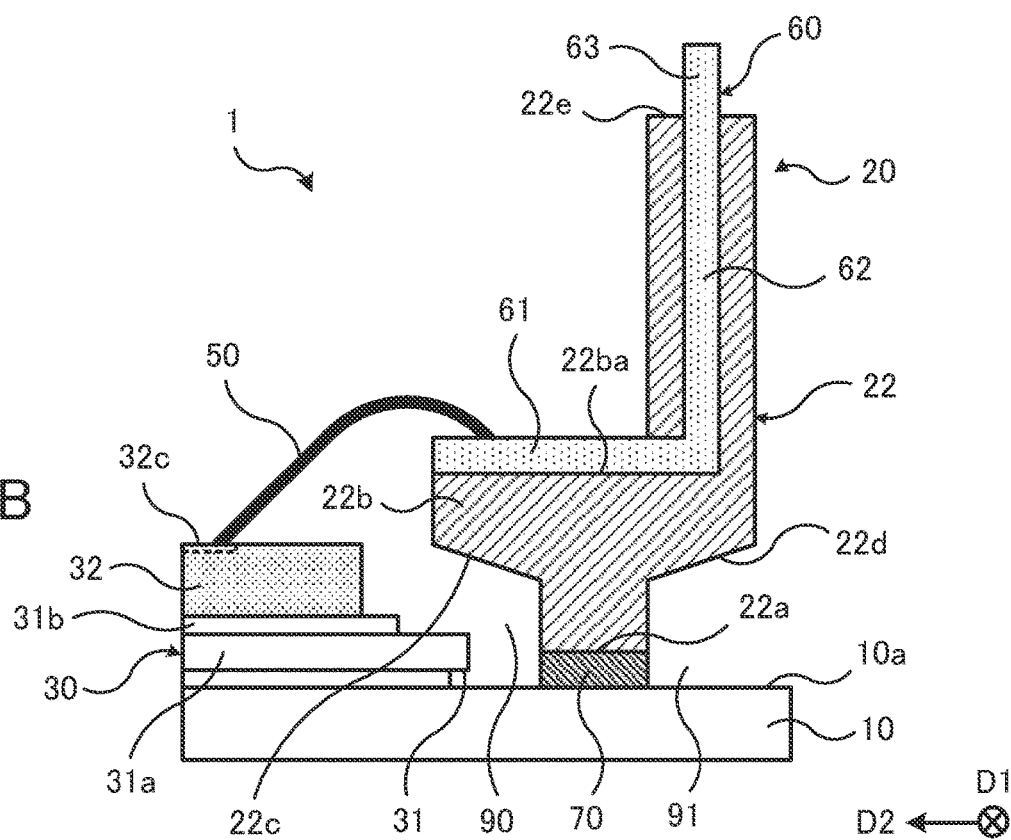

FIGS. 4A and 4B illustrate a configuration example of a wire bonding part of the semiconductor device according to the first embodiment. FIG. 4A is a schematic plan view with relevant parts of the example of the wire bonding part, and FIG. 4B is a schematic cross-sectional view along line IV-IV of FIG. 4A.

The wire bonding part depicted in FIGS. 4A and 4B includes a part of the insulated circuit board 31 and a part of the semiconductor element 32 of one electronic component 30 placed on the principal surface 10a of the baseplate 10, a part of the dividing wall 22 of the resin case 20, extending in the direction D1, and the wire 50 connecting between the bonding part 61 of the terminal 60 provided in the dividing wall 22 and the control electrode 32c of the semiconductor element 32.

The dividing wall 22 of the resin case 20 is fixed to the principal surface 10a of the baseplate 10 as a lower end 22a of the dividing wall 22 is bonded thereto via the adhesive 70. A terrace part 22b is provided on a sidewall of the dividing wall 22 such as to be positioned further away from the principal surface 10a of the baseplate 10 than the lower end 22a and to hang out toward the internal space (i.e., toward the electronic component 30) compared to the lower end 22a, parallel to the principal surface 10a and in a direction D2 perpendicular to the direction D1 in which the dividing wall 22 extends. For example, a top face 22ba of the terrace part 22b also extends over a region directly above the lower end 22a. A gap 90 is formed on a first side of the lower end 22a in the direction D2, between the principal surface 10a of the baseplate 10 and the terrace part 22b of the dividing wall 22, hanging out in the direction D2. The terrace part 22b is provided with a face 22c opposing the principal surface 10a of the baseplate 10 across the gap 90, which is inclined or tapered such that a point on the face 22c becomes closer to the principal surface 10a of the baseplate 10 toward the lower end 22a of the dividing wall 22.

For example, the electronic component 30 is arranged within each component such that a part of the electronic component 30 around where the terrace part 22b hangs out (a part of the insulated circuit board 31 in this example) is positioned in the gap 90 between the terrace part 22b of the dividing wall 22 and the principal surface 10a of the baseplate 10, as illustrated in FIGS. 4A and 4B (see also in FIGS. 1 and 2). This positional arrangement allows miniaturization of the semiconductor device 1 in the direction D2. In addition, forming the face 22c of the terrace part 22b of the dividing wall 22, which opposes the principal surface 10a of the baseplate 10, to be inclined or tapered prevents voids from being formed in the gap 90 when the sealant 40 is supplied to each compartment with the electronic component 30 and the like disposed therein and then cured. The tapered face 22c also allows a fillet to be formed in the sealant 40 encapsulating the electronic component 30 disposed in the compartment.

In addition, the dividing wall 22 of the resin case 20 is provided with a face 22d opposing the principal surface 10a of the baseplate 10 across a gap 91, on a second side of the lower end 22a in the direction D2 (i.e., on the side of the lower end 22a opposite to the first side). Specifically, the face 22d is located at a sidewall of the dividing wall 22 on the opposite side from the terrace part 22b hanging out in the direction D2. As in the case of the face 22c of the terrace part 22b, the face 22d is inclined or tapered such that a point on the face 22d becomes closer to the principal surface 10a of the baseplate 10 toward the lower end 22a. The electronic component 30 is also arranged within each compartment such that a part of the electronic component 30 on the opposite side to where the terrace part 22b hangs out is positioned in the gap 91 (see FIGS. 1 and 2), which facilitates miniaturization of the semiconductor device 1. Making the face 22d inclined or tapered prevents voids from being formed in the sealant 40 supplied to each compartment and cured. The tapered face 22d also allows a fillet to be formed in the sealant 40 encapsulating the electronic component 30 disposed in the compartment.

Each of the dividing walls 22 of the resin case 20 is provided with the terminals 60. Each of the terminals 60 includes the bonding part 61, an intermediate part 62, and an end part 63. The bonding part 61 is arranged in the terrace part 22b of the dividing wall 22 such as to be exposed from the top face 22ba. Provided that the bonding part 61 is exposed from the top face 22ba of the terrace part 22b, it may be buried down below or project upward from the top face 22ba. The intermediate part 62 is connected to the bonding part 61 and fixed to the dividing wall 22 while, for example, being embedded within the dividing wall 22. The end part 63 is connected to the intermediate part 62 and projects from an upper end 22e of the dividing wall 22 so as to allow external connection. The dividing walls 22 provided with the terminals 60 each including the foregoing bonding part 61, intermediate part 62, and end part 63 are formed by, for example, insert molding.

Referring to FIGS. 4A and 4B, for example, the wire 50 has a first end bonded to the bonding part 61 of the terminal 60, which is disposed on the terrace part 22b of the dividing wall 22 of the resin case 20, while a second end thereof is connected to the control electrode 32c of the semiconductor element 32 of the electronic component 30.

Note that FIGS. 4A and 4B take the dividing wall 22 of the resin case 20 for example; however, also on one side of the external wall 21 parallel to the dividing wall 22 extending in the direction D1, the terrace part 22b hanging out in the direction D2 may similarly be formed, as illustrated in FIGS. 1 and 2 above. Here, the terminals 60 are arranged such that the bonding parts 61 thereof are disposed on the terrace part 22b. Then, to the bonding part 61 of each terminal 60, the first end of the wire 50 is bonded whose second end is bonded to the control electrode 32c of the semiconductor element 32 of the electronic component 30.

Instead of the first end of the wire 50 whose second end is connected to the control electrode 32c of the semiconductor element 32, the first end of the wire 50 whose second end is bonded to the load electrode 32b may be bonded to the bonding part 61 of each terminal 60 provided in the dividing walls 22 and the one side of the external wall 21 of the resin case 20. Although no illustrative figure is given here, the first end of the wire 50 whose second end is bonded to the Cu layer 31b of the insulated circuit board 31 on which the semiconductor element 32 is mounted may be bonded to the bonding part 61 of each terminal 60 provided on the dividing walls 22 and the one side of the external wall 21.

Ultrasonic bonding is, for example, used to join the wires 50 to the bonding parts 61, disposed on the terrace parts 22b, of the terminals 60 provided in the dividing walls 22 and the one side of the external wall 21 of the resin case 20. In this case, depending on the configuration of each bonding part 61 and that of the dividing wall 22 or the one side of the external wall 21 in which the bonding part 61 is disposed, the bonding strength between the wire 50 and the bonding part 61 may decrease due to lack of ultrasonic bonding power applied to the bonding part 61. Decreased bonding strength between the wire 50 and the bonding part 61 is likely to result in quality loss and decreased reliability of the semiconductor device 1.

As for bonding of the wire 50 to the bonding part 61 using ultrasonic bonding, a voltage controlled oscillator (VCO) voltage is used as an index in assessing the bonding state between the bonding part 61 and the wire 50. The VCO voltage represents changes in oscillation frequency of an oscillation circuit designed to follow changes in resonance frequency of an ultrasonic transducer.

Figure 5:
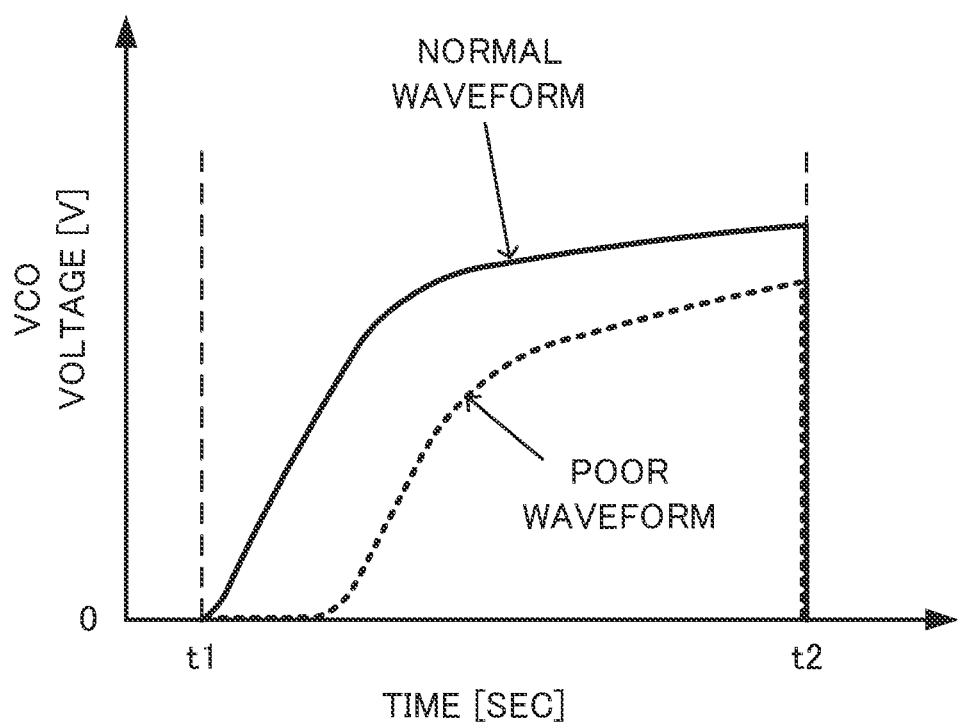
FIG. 5 illustrates transitions of VCO voltage during ultrasonic bonding.

FIG. 5 illustrates transitions of the VCO voltage during ultrasonic bonding. In FIG. 5, the horizontal axis represents time [sec] and the vertical axis represents VCO voltage [V].

Here, a VCO voltage waveform obtained when the bonding state between the bonding part 61 and the wire 50 is normal is referred to as "normal waveform" while a VCO voltage waveform obtained when the bonding state therebetween is poor is referred to as "poor waveform". In FIG. 5, the solid line and the dotted line represent the normal waveform and the poor waveform, respectively. The normal waveform observed when the bonding between the bonding part 61 and the wire 50 is normal starts rising at the beginning of ultrasound application t1 and decreases to 0 V at the end of the application t2, as depicted by the solid line in FIG. 5. On the other hand, the poor waveform (the dotted line in FIG. 5) observed when the bonding between the bonding part 61 and the wire 50 is poor does not rise immediately at the beginning of ultrasound application t1 and then begins changing after a while. Thus, the VCO voltage exhibits different waveforms for the normal and poor bonding states.

This difference is utilized to, for example, assess the bonding state between the bonding part 61 and the wire 50 being either normal or poor based on a VCO voltage waveform acquired during ultrasonic bonding of the wire 50 to the bonding part 61, or based on a comparison between the acquired VCO voltage waveform and a reference normal waveform.

In the above-described semiconductor device 1, parameters likely to affect the bonding state between the bonding part 61 of each terminal 60, disposed on the terrace parts 22b of the dividing walls 22 and the one side of the external wall 21 extending in the direction D1, and the wire 50 connected to the bonding part 61 include, for example, the width of the bonding part 61 in the direction D1 and the diameter of the wire 50 bonded to the bonding part 61.

Figure 6:
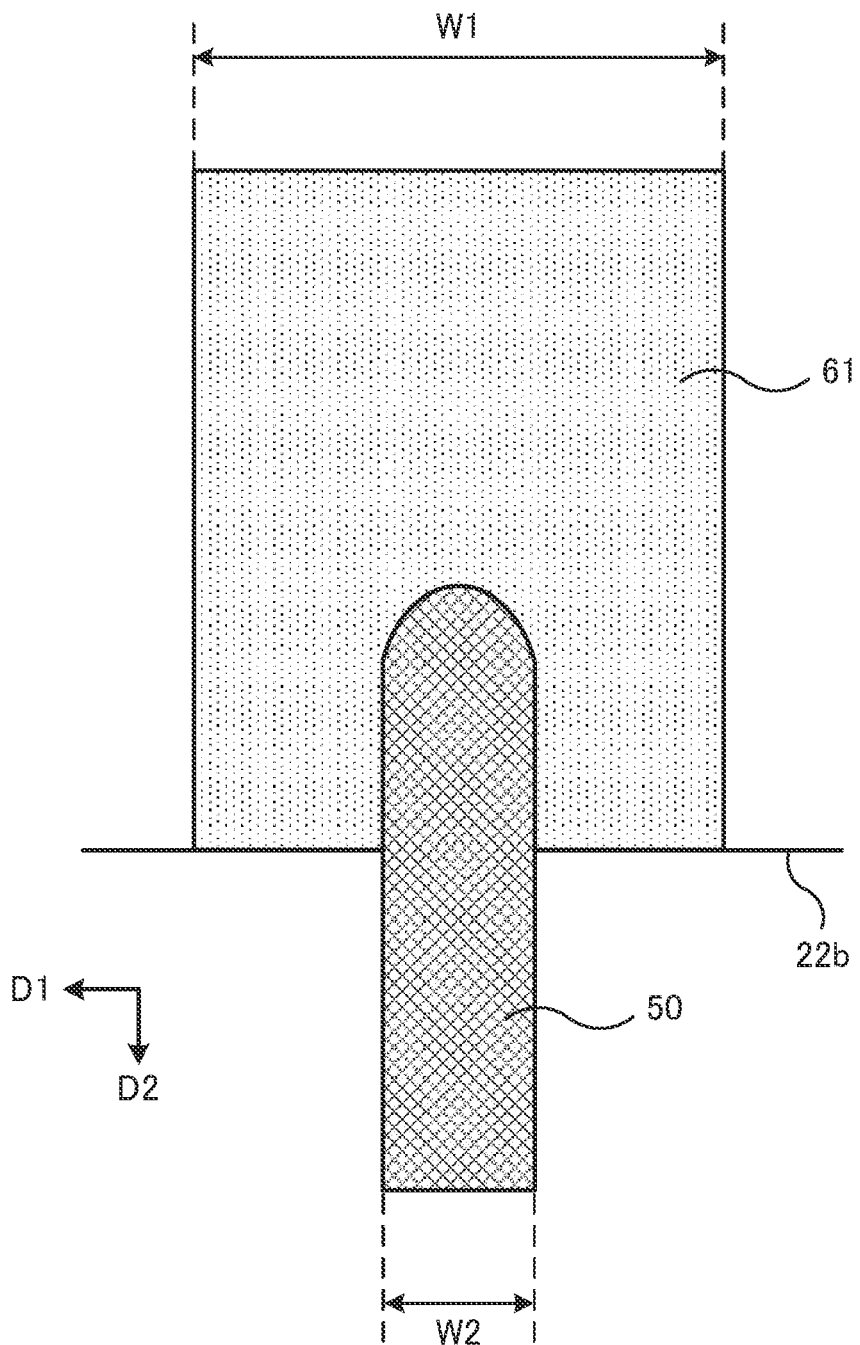
FIG. 6 illustrates a relationship between width of a bonding part of a terminal and diameter of a wire according to the first embodiment.

FIG. 6 illustrates the relationship between the width of the bonding part of the terminal and the diameter of the wire according to the first embodiment. FIG. 6 is a schematic plan view of the bonding part of the terminal and the wire bonded thereto.

In FIG. 6, W1 is the width of the bonding part 61 in the direction D1 where the dividing wall 22 or the one side of the external wall 21 with the terrace part 22b, on which the bonding part 61 is disposed, extends; and W2 is the diameter of the wire 50 bonded to the bonding part 61.

An assessment of the bonding state between the bonding part 61 and the wire 50 was conducted. Specifically, ultrasonic bonding was used to bond the wire 50 to the bonding part 61 while changing the combination of the width W1 of the bonding part 61 and the diameter W2 of the wire 50 connected thereto, and a VCO voltage waveform was obtained for each combination and used to assess the bonding state. Assessment results of the bonding state between the bonding part 61 and the wire 50 based on VCO voltage waveforms are presented in Table 1 below.

TABLE 1

BONDING STATE BASED ON VCO VOLTAGE WAVEFORM

| | | WIDTH OF JOINING PART W1 | | |
|---|---|---|---|---|
| | | 1 mm | 1.5 mm | 3 mm |
| DIAMETER OF WIRE W2 | 400 μm | POOR | — | NORMAL |
| | 300 μm | POOR | POOR | NORMAL |
| | 150 μm | NORMAL | — | NORMAL |

With reference to Table 1, when the wire 50 with the diameter W2 of 400 μm is bonded by ultrasonic bonding to the bonding part 61 with the width W1 in the direction D1 of 1 mm, the obtained VCO voltage waveform is classified as a poor waveform, and the bonding state between the bonding part 61 and the wire 50 is therefore assessed as "poor". Similarly, in the case of bonding the wire 50 with the diameter W2 of 300 μm by ultrasonic bonding to the bonding part 61 with the width W1 in the direction D1 of 1 mm, the bonding state is assessed as "poor" based on the VCO voltage waveform obtained. On the other hand, when the wire 50 with the diameter W2 of 150 μm is bonded by ultrasonic bonding to the bonding part 61 with the width W1 in the direction D1 of 1 mm, the obtained VCO voltage waveform is classified as a normal waveform, and the bonding state therebetween is therefore assessed as "normal".

According to Table 1, when the wire 50 with the diameter W2 of 300 μm is bonded by ultrasonic bonding to the bonding part 61 with the width W1 in the direction D1 of 1.5 mm, the obtained VCO voltage waveform is classified as a poor waveform, and the bonding state therebetween is therefore assessed as "poor".

According to Table 1, when each of the wires 50 with the diameters W2 of 400 μm, 300 μm, and 150 μm is bonded by ultrasonic bonding to the bonding part 61 with the width W1 in the direction D1 of 3 mm, the obtained VCO voltage waveforms are all classified as normal waveforms, and the bonding states therebetween for all the cases are therefore assessed as "normal".

Tension assessments under prescribed conditions were then conducted for the individual ultrasonic bonded structures of the bonding part 61 and the wire 50, each with an assessed combination of the width W1 and the diameter W2 summarized in Table 1. Results of the tension assessments are presented in Table 2 below, together with the results of the assessment of the bonding states based on the VCO voltage waveforms and the ratios of the diameter W2 to the width W1, W2/W1[-].

TABLE 2

| BONDING STATE BASED ON VCO VOLTAGE WAVEFORM | W2/W1 [—] | TENSION ASSESSMENT |
|---|---|---|
| NORMAL | 0.050 | WIRE BASE MATERIAL DAMAGED |
| NORMAL | 0.100 | WIRE BASE MATERIAL DAMAGED |
| NORMAL | 0.133 | WIRE BASE MATERIAL DAMAGED |
| NORMAL | 0.150 | WIRE BASE MATERIAL DAMAGED |
| POOR | 0.200 | BONDING INTERFACE DAMAGED |
| POOR | 0.300 | BONDING INTERFACE DAMAGED |
| POOR | 0.400 | BONDING INTERFACE DAMAGED |

With reference to Table 2, in the tension assessments, the bonded structure with W2/W1=0.050 (150 μm/3 mm) whose bonding state was assessed as "normal" based on the VCO voltage waveform suffered damage of, not the bonding interface of the bonding part 61 and the wire 50, but the base material of the wire 50. Similarly, damage of the base material of the wire 50 was observed in each of the bonded structures with W2/W1=0.100 (300 μm/3 mm), 0.133 (400 μm/3 mm), and 0.150 (150 μm/1 mm), whose bonding states were assessed as "normal" based on their VCO voltage waveforms.

On the other hand, the bonded structures with W2/W1=0.200 (300 μm/1.5 mm), 0.300 (300 μm/1 mm), and 0.400 (400 μm/1 mm), whose bonding states were assessed as "poor" based on their VCO voltage waveforms suffered damage of, not the base material of the wire 50, but the bonding interface of the bonding part 61 and the wire 50.

The results summarized in Tables 1 and 2 indicate that the bonded structures each with a combination of the width W1 and the diameter W2 whose bonding state between the bonding part 61 and the wire 50 was assessed as "normal" based on the VCO voltage waveform exhibit higher bonding strength between the bonding part 61 and the wire 50 compared to the bonded structures with the combinations of the width W1 and the diameter W2 whose bonding states were assessed as "poor". It is also seen that bonded structures of the bonding part 61 and the wire 50, having "normal" bonding states assessed based on their VCO voltage waveforms and also exhibiting high bonding strength, are achieved by selecting combinations of the width W1 of the bonding part 61 and the diameter W2 of the wire 50 with W2/W1[-]≤0.15.

In the semiconductor device 1, the terrace parts 22b hanging out in the individual compartments separated by the dividing walls 22 are provided in the dividing walls 22 and the one side of the external wall 21 of the resin case 20, as described above. The gap 90 resides between each of the dividing walls 22 and the principal surface 10a of the baseplate 10. Using ultrasonic bonding, the wire 50 is bonded to the bonding part 61 of each terminal 60, disposed on the terrace part 22b above the gap 90. However, this structure with the presence of gap 90 below the terrace part 22b may interfere with application of sufficient ultrasonic bonding power to the bonding part 61 in bonding the wire 50 to the bonding part 61 disposed on the terrace part 22b. Especially, this lack of ultrasonic bonding power applied to the bonding part 61 tends to readily take place when the width W1 of the bonding part 61 is narrow. Insufficient application of ultrasonic bonding power to the bonding part 61 may result in decreased bonding strength between the wire 50 and the bonding part 61.

On the other hand, by setting the width W1 of the bonding part 61 and the diameter W2 of the wire 50 such that the ratio W2/W1[-] is less than or equal to 0.15, the width W1 of the bonding part 61 becomes sufficiently large relative to the diameter W2 of the wire 50. This allows sufficient power to be applied during ultrasonic bonding to the bonding part 61 disposed on the terrace part 22b with the gap 90 residing on its lower side. This ratio W2/W1[-] setting of ≤0.15 achieves bonded structures of the bonding part 61 and the wire 50, having "normal" bonding states assessed based on VCO voltage waveforms and also exhibiting high bonding strength. Herewith, it is possible to offer the semiconductor device 1 with excellent quality and reliability in terms of the bonded structures of the wire 50 and the bonding part 61 of each terminal 60 provided in the dividing walls 22 of the resin case 20.

In addition, the association of a bonding area A and load L of the wire 50 with the bonding part 61 was assessed for the individual ultrasonic bonded structures of the bonding part 61 and the wire 50, each with an assessed combination of the width W1 and the diameter W2 summarized in Table 1. Results of the assessments are presented in Table 3 below, together with the results of the assessment of the bonding states based on the VCO voltage waveforms and the ratios of the diameter W2 to the width W1, W2/W1[-].

TABLE 3

| VCO VOLTAGE WAVEFORM | W2/W1 [—] | BONDING AREA A [mm$^2$] | LOAD L [g] | A/L [mm$^2$/g] |
|---|---|---|---|---|
| NORMAL | 0.050 | 0.043898 | 170 | 0.000258 |
| NORMAL | 0.100 | 0.219224 | 700 | 0.000313 |
| NORMAL | 0.133 | 0.356720 | 1100 | 0.000324 |
| NORMAL | 0.150 | 0.047040 | 170 | 0.000277 |
| POOR | 0.200 | 0.157048 | 700 | 0.000224 |
| POOR | 0.300 | 0.158772 | 700 | 0.000227 |
| POOR | 0.400 | 0.185416 | 1100 | 0.000169 |

In the case of using the wires 50 each with the diameter W2 of 150 μm, 300 μm, and 400 μm, the load L was set to be 170 g, 700 g, and 1100 g, respectively. Each wire 50 with the predetermined diameter W2 was bonded by ultrasonic bonding under the foregoing corresponding condition of the load L, to measure the bonding area A of the wire 50 on the bonding part 61.

With reference to Table 3, each bonded structure with a combination of the width W1 and the diameter W2 whose bonding state between the bonding part 61 and the wire 50 was assessed as "normal" based on its VCO voltage waveform (i.e., W2/W1=0.050, 0.100, 0.133, and 0.150) had the ratio of the bonding area A to the load L, A/L [mm$^2$/g], more than 0.00025 mm$^2$/g. On the other hand, each bonded structure with a combination of the width W1 and the diameter W2 whose bonding state between the bonding part 61 and the wire 50 was assessed as "poor" based on its VCO voltage waveform (i.e., W2/W1=0.200, 0.300, and 0.400) had the ratio A/L below 0.00025 mm$^2$/g.

According to the results summarized in Table 3, it may be considered appropriate to select a combination of the bonding part 61 disposed on the terrace part 22b with the gap 90 residing on its lower side and the wire 50 bonded to the bonding part 61 by ultrasonic bonding such that the ratio A/L becomes more than or equal to 0.00025 mm$^2$/g. Specifically, a combination of the width W1 of the bonding part 61 and the diameter W2 of the wire 50 allowing the ratio A/L in ultrasonic bonding to be more than or equal to 0.00025 mm$^2$/g may be selected. This combination selection ensures bonded structures of the bonding part 61 and the wire 50, having "normal" bonding states assessed based on VCO voltage waveforms and also exhibiting high bonding strength. Herewith, it is possible to offer the semiconductor device 1 with excellent quality and reliability in terms of the bonded structures of the wire 50 and the bonding part 61 of each terminal 60 provided in the dividing walls 22 of the resin case 20.

A thermal cycle test was conducted using the semiconductor device 1 with the ratio of the width W1 of the bonding part 61 to the diameter W2 of the wire 50 being less than or equal to 0.15 (i.e., W2/W1[-]≤0.15). As an example of the semiconductor device 1 with W2/W1[-]≤0.15, the semiconductor device 1 having the bonding part 61 with the width W1 of 3 mm and the wire 50 with the diameter W2 of 300 μm was used in the test. For the purposes of comparison, a thermal cycle test was conducted in the same manner using the semiconductor device 1 with the ratio W2/W1[-] not satisfying W2/W1[-]≤0.15. As an example of the semiconductor device 1 not complying with W2/W1[-]≤0.15, the semiconductor device 1 having the bonding part 61 with the width W1 of 1 mm and the wire 50 with the diameter W2 of 300 μm was used in the test. In the thermal cycle test using liquid-to-liquid thermal shock test equipment, the number of cycles to open failure of the bonding between the bonding part 61 and the wire 50 was found, where one cycle included a process of changing temperature in the range between −40° C. and 125° C.

Results of the thermal cycle test found that the semiconductor device 1 of the comparison example (i.e., not complying with W2/W1[-]≤0.15, where the width W1 of the bonding part 61 is 1 mm and the diameter W2 of the wire 50 is 300 μm) caused open failure between the bonding part 61 and the wire 50 at the 1000$^{th}$ cycle. On the other hand, no open failure between the bonding part 61 and the wire 50 was observed in the semiconductor device 1 satisfying W2/W1[-]≤0.15, where the width W1 of the bonding part 61 is 3 mm and the diameter W2 of the wire 50 is 300 μm, even at the 2000$^{th}$ cycle.

Setting the ratio W2/W1[-] of the diameter W2 of the wire 50 to the width W1 of the bonding part 61 to 0.15 or less increases the bonding strength between the bonding part 61 and the wire 50. Herewith, it is possible to offer the semiconductor device 1 with excellent quality and reliability.

In the case where, in the semiconductor device 1, multiple bonding parts 61 of the terminals 60 are disposed on each terrace part 22b of the dividing walls 22 and the one side of the external wall 21 of the resin case 20, extending in the direction D1, these bonding parts 61 may include ones with the same width or different widths W1 in the direction D1.

For example, in the case of disposing multiple bonding parts 61 with the same width W1 on the terrace part 22b, the width W1 is arranged to satisfy W2/W1[-]≤0.15 in relation to the diameter W2 of the wire 50 predetermined to be used for bonding. Alternatively, the wire 50 with the diameter W2 satisfying W2/W1[-]≤0.15 in relation to the predetermined width W1 of the multiple bonding parts 61 is selected for bonding.

Also, in the case of disposing multiple bonding parts 61 with different widths W1 on the terrace part 22b, the widths W1 of the bonding parts 61 and the diameter W2 of the wire 50 are arranged to satisfy W2/W1[-]≤0.15.

Figure 7A:
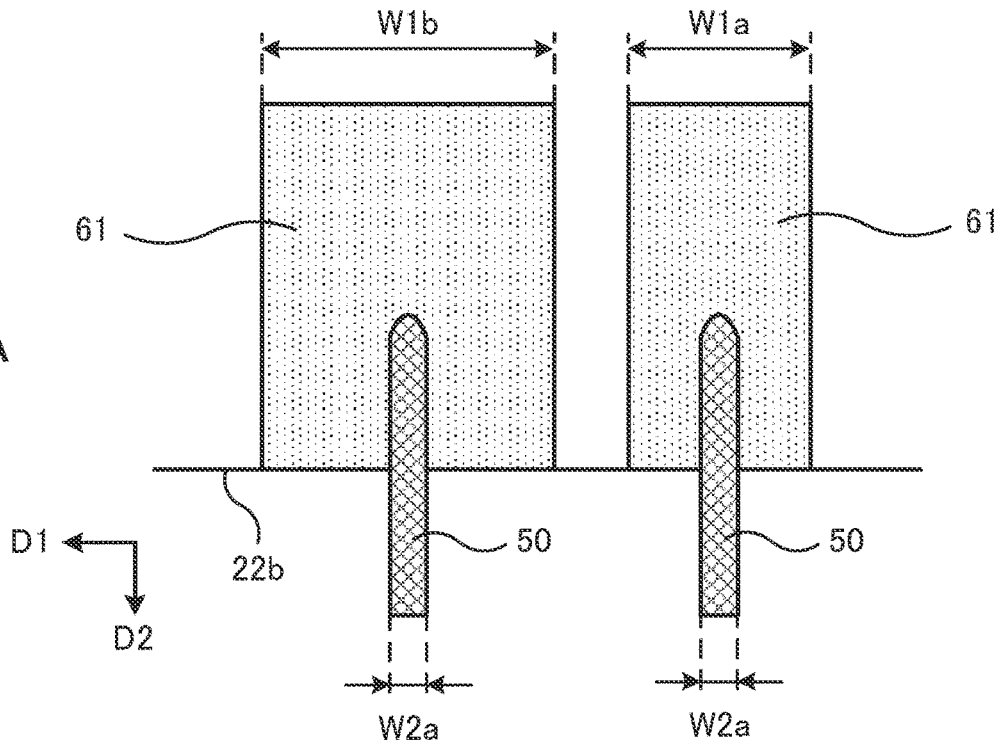
FIGS. 7A and 7B illustrate examples of bonded structures each consisting of the bonding part of the terminal and the wire.
Figure 7B:
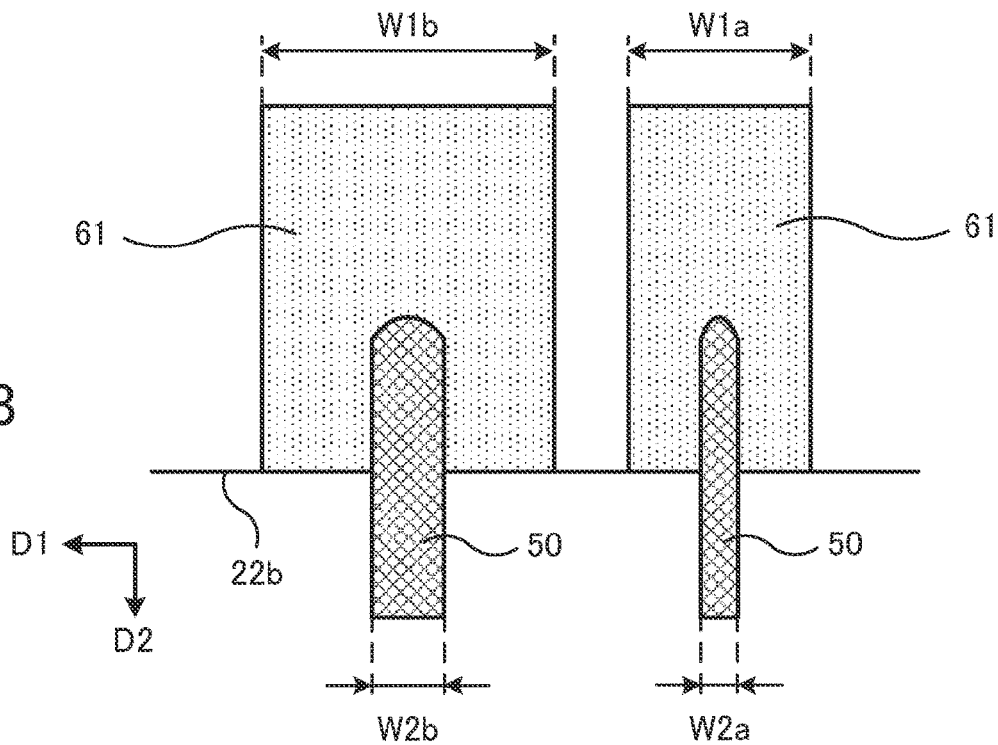

FIGS. 7A and 7B illustrate examples of bonded structures each consisting of the bonding part of the terminal and the wire according to the first embodiment. FIGS. 7A and 7B are schematic plan views of the bonding parts of the terminals and wires connected thereto.

FIG. 7A depicts a case where the bonding parts 61 disposed on the terrace part 22b individually have widths W1a and W1b in the direction D1, different from each other (W1b>W1a). In this case, the wires 50 used for bonding have a diameter W2a satisfying a ratio inequality of W2a/W1a[-]≤0.15, which focuses on the bonding part 61 with the comparatively smaller width W1a. The use of the wires 50 with the diameter W2a satisfies not only the ratio inequality W2a/W1a[-]≤0.15, which is associated with the bonding part 61 with the comparatively smaller width W1a, but also a ratio inequality of W2a/W1b[-]≤0.15, which is associated with the bonding part 61 with the comparatively larger width W1b. This means that, on the same terrace part 22b, both the bonding parts 61 having the widths W1a and W1b different from each other are bonded to the wires 50 at high strength.

FIG. 7B depicts another case where the bonding parts 61 disposed on the terrace part 22b individually have the widths W1a and W1b in the direction D1, different from each other (W1b>W1a). In this case, the wires 50 each satisfying a predetermined corresponding condition may be used for bonding. That is, for the bonding part 61 with the comparatively smaller width W1a, the wire 50 with the diameter W2a satisfying W2a/W1a[-]≤0.15 is used for bonding. On the other hand, for the bonding part 61 with the comparatively larger width W1b, the wire 50 with a diameter W2b (W2b>W2a) satisfying W2b/W1b[-]≤0.15 is used for bonding. In this manner, the diameters W2a and W2b of the wires 50 to be used are changed in accordance with the widths W1a and W1b of the bonding parts 61 disposed on the terrace part 22b. Herewith, on the same terrace part 22b, both the bonding parts 61 having widths W1a and W1b different from each other are bonded to the wires 50 at high strength.

(b) Second Embodiment

Figure 8A:
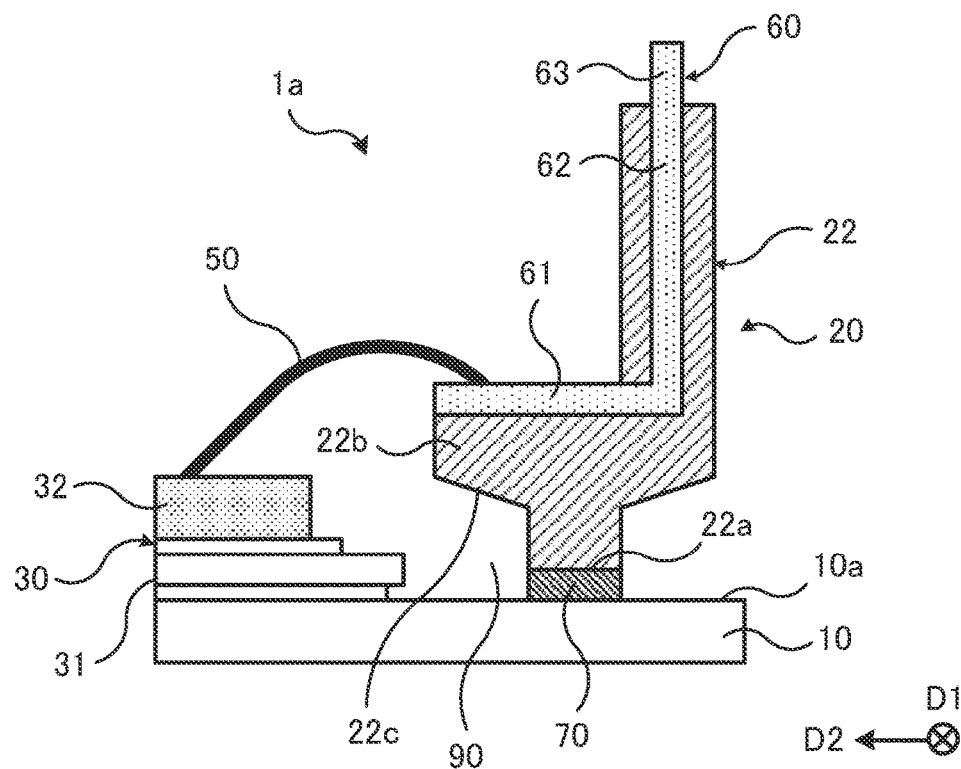
FIGS. 8A and 8B illustrate examples of a semiconductor device according to a second embodiment.
Figure 8B:
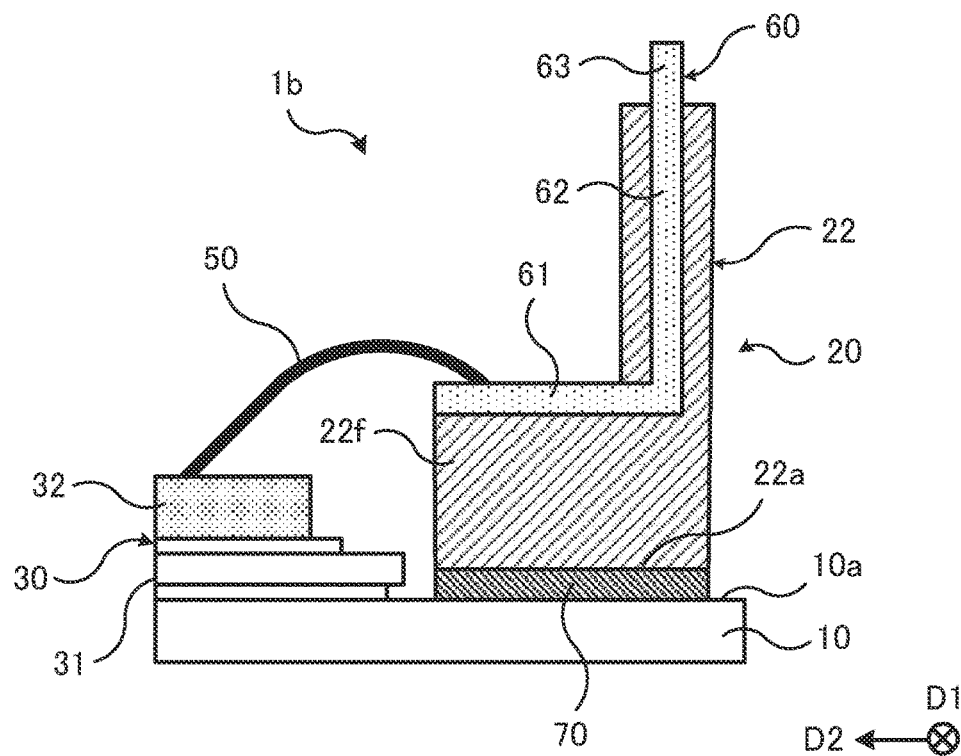

FIGS. 8A and 8B illustrate examples of a semiconductor device according to a second embodiment. Each of FIGS. 8A and 8B provides a schematic cross-sectional view with relevant parts of an example of a wire bonding part of the semiconductor device.

A semiconductor device 1a of FIG. 8A differs from the above-described semiconductor device 1 of the first embodiment in having a configuration in which a part of the electronic component 30 is not positioned in the gap 90 between the terrace part 22b of the dividing wall 22 of the resin case 20 and the principal surface 10a of the baseplate 10.

Also in the semiconductor device 1a with such a configuration, the bonding strength between the bonding part 61 and the wire 50 is increased by setting the ratio of the diameter of the wire 50 (the diameter W2 of FIG. 6) to the width of the bonding part 61 in the direction D1 (the width W1 of FIG. 6), of the terminal 60, disposed on the terrace part 22b to 0.15 or less, in line with the example described in the first embodiment above.

In the semiconductor device 1a, the electronic component 30 is positioned outside the gap 90 between the terrace part 22b and the principal surface 10a of the baseplate 10, which allows the sealant 40 supplied after bonding of the wire 50 to sufficiently penetrate into the gap 90. In addition, air bubbles trapped in the sealant 40 having entered the gap 90 are likely to be released without the electronic component 30 getting in the way. Further, a fillet of adequate size is formed in the sealant 40 encapsulating the electronic component 30, which increases the bonding strength of the electronic component 30.

On the other hand, a semiconductor device 1b of FIG. 8B differs from the above-described semiconductor device 1 of the first embodiment in having a configuration in which the dividing wall 22 of the resin case 20 is provided with a terrace part 22f having no gap with the principal surface 10a of the baseplate 10.

Also in the semiconductor device 1b with such a configuration, the bonding strength between the bonding part 61 and the wire 50 is increased by setting the ratio of the diameter of the wire 50 (the diameter W2 of FIG. 6) to the width of the bonding part 61 in the direction D1 (the width W1 of FIG. 6), of the terminal 60, disposed on the terrace part 22f to 0.15 or less, in line with the example described in the first embodiment above.

The semiconductor device 1b with no gap provided directly beneath the terrace part 22f on which the bonding part 61 is disposed is less likely to experience a situation where bonding power is not sufficiently applied to the bonding part 61 during ultrasonic bonding of the wire 50, and it is therefore possible to transmit power to the bonding part 61 more efficiently. This, for example, reduces load during ultrasonic bonding, which in turn reduces the impact on the bonding part 61 and the terrace part 22f with the bonding part 61 disposed thereon.

Note that the foregoing examples are described using the dividing wall 22 of the resin case 20; however, the configurations of FIGS. 8A and 8B may also be applied similarly to the one side of the external wall 21 parallel to the dividing wall 22, in which the terminals 60 are provided.

(c) Third Embodiment

Figure 9:
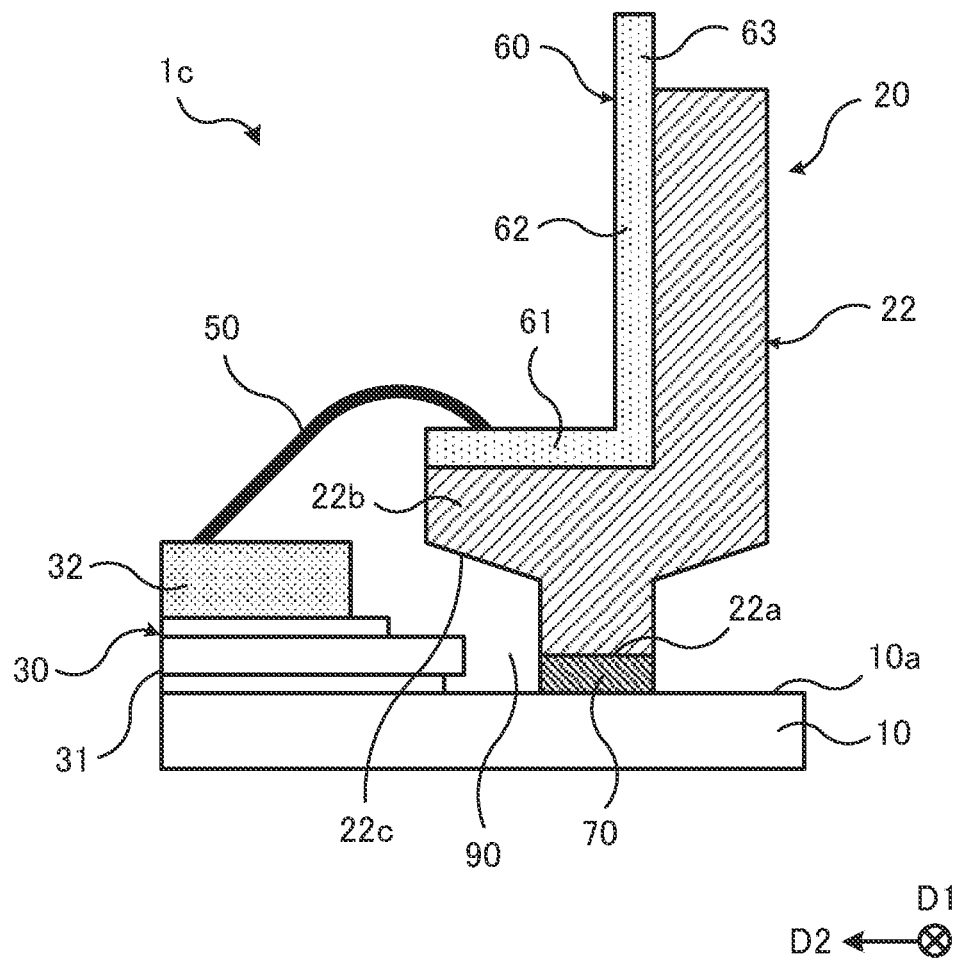
FIG. 9 illustrates an example of a semiconductor device according to a third embodiment.

FIG. 9 illustrates an example of a semiconductor device according to a third embodiment. FIG. 9 provides a schematic cross-sectional view with relevant parts of an example of a wire bonding part of the semiconductor device.

A semiconductor device 1c of FIG. 9 differs from the above-described semiconductor device 1 of the first embodiment in having a configuration in which the intermediate part 62 of the terminal 60 provided in the dividing wall 22 of the resin case 20 is placed external to the dividing wall 22.

Also in the semiconductor device 1c with such a configuration, the bonding strength between the bonding part 61 and the wire 50 is increased by setting the ratio of the diameter of the wire 50 (the diameter W2 of FIG. 6) to the width of the bonding part 61 in the direction D1 (the width W1 of FIG. 6), of the terminal 60, disposed on the terrace part 22b to 0.15 or less, in line with the example described in the first embodiment above.

In the semiconductor device 1c, the terminal 60 including the bonding part 61 to which the wire 50 is bonded; the intermediate part 62 connected to the bonding part 61; and the end part 63 connected to the intermediate part 62 is fastened to the surface of a sidewall of the dividing wall 22, located on the side where the terrace part 22b hangs out. Specifically, the bonding part 61 and the intermediate part of the terminal 60 are fixed onto the surface of the sidewall. For example, the terminal 60 is provided with a lock part which is locked onto the sidewall of the dividing wall 22 to thereby fix the bonding part 61 and the intermediate part 62 of the terminal 60 onto the dividing wall 22. Alternatively, a lock part provided on the sidewall of the dividing wall 22 locks in the terminal 60, to thereby fix the bonding part 61 and the intermediate part 62 of the terminal 60 onto the dividing wall 22. Yet alternatively, a mating part provided on the sidewall of the dividing wall 22 mates with the terminal 60, to thereby fix the bonding part 61 and the intermediate part 62 of the terminal 60 onto the dividing wall 22. Furthermore, the bonding part 61 and the intermediate part 62 of the terminal 60 may be fixed via an adhesive onto the sidewall of the dividing wall 22, or may be fixedly screwed to the sidewall of the dividing wall 22.

Note that the foregoing examples are described using the dividing wall 22 of the resin case 20; however, the configurations of FIG. 9 may also be applied similarly to the one side of the external wall 21 parallel to the dividing wall 22, in which the terminals 60 are provided.

The semiconductor device 1c eliminates the need for insert molding of the resin case 20 with the dividing walls 22 and the external wall 21 where the intermediate part 62 of each terminal 60 is embedded within the dividing walls 22 and the external wall 21, which allows simplification and cost reduction of the formation process of the resin case 20.

According to one aspect, it is possible to increase the bonding strength between the wire and the bonding part of the terminal provided in the resin case.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a baseplate having a principal surface;
   a resin case including an external wall surrounding an internal space and a dividing wall extending in a first direction and separating the internal space into a plurality of compartments, the dividing wall having a lower end which is fixed to the principal surface via an adhesive and including a terrace part provided on a sidewall thereof at a position farther away from the principal surface than is a position of the lower end and extending toward the internal space farther than is the lower end in a second direction parallel to the principal surface and perpendicular to the first direction;
   a terminal including a bonding part disposed on the terrace part;
   a first electronic component disposed on the principal surface in one of the plurality of compartments where the terrace part extends;
   a second electronic component disposed on the principal surface in another one of the plurality of compartments that is located at a position opposite to a position where the terrace part extends; and
   a wire bonded to the bonding part, the first electronic component connected to the bonding part by the wire, wherein:
   the wire has a diameter that is at most 0.15 of a width of the bonding part in the first direction,
   the dividing wall includes a first gap at one of two opposite sides of the lower end that are spaced apart in the second direction, and a second gap at the other one of the two opposite sides,
   the first gap is provided between the principal surface and the terrace part,
   the second gap is provided between the principal surface and an upward portion of the dividing wall that extends upward from the terrace part in a direction orthogonal to the principal surface;
   the upward portion of the dividing wall is provided within the second gap in a plan view, and
   a part of the electronic component is positioned in the second gap between the upward portion of the dividing wall and the principal surface.

2. The semiconductor device according to claim 1, wherein:
   the terminal further includes:
      an intermediate part connected to the bonding part and being fixed to the dividing wall, and
      an end part connected to the intermediate part and projecting from an upper end of the dividing wall.

3. The semiconductor device according to claim 1, wherein:
   the terrace part has an opposing face facing the principal surface and being tapered such that a point on the opposing face becomes closer to the principal surface toward the lower end.

4. The semiconductor device according to claim 1, wherein:
   a part of the first electronic component is positioned in the first gap between the terrace part and the principal surface.

5. The semiconductor device according to claim 1, further comprising:
   a sealant installed in the resin case and sealing the terrace part, the bonding part, and the wire.

6. A semiconductor device manufacturing method, comprising:
   preparing a resin case including an external wall surrounding an internal space and a dividing wall extending in a first direction and separating the internal space into a plurality of compartments, a bonding part of a terminal being provided on the dividing wall;
   disposing the resin case on a principal surface of a baseplate;
   disposing a first electronic component on the principal surface in one of the plurality of compartments where the terrace part extends;
   disposing a second electronic component on the principal surface in another one of the plurality of compartments that is located at a position opposite to a position where the terrace part extends; and
   bonding a wire to the bonding part on the dividing wall of the resin case, and connecting the first electronic component to the bonding part by the wire, wherein:
   the dividing wall has a lower end which is fixed to the principal surface via an adhesive and includes a terrace part provided on a sidewall thereof at a position farther away from the principal surface than is a position of the lower end and extending toward the internal space farther than is the lower end in a second direction parallel to the principal surface and perpendicular to the first direction,
   the bonding part is disposed on the terrace part,
   the wire has a diameter that is at most 0.15 of a width of the bonding part in the first direction,
   the dividing wall includes a first gap at one of two opposite sides of the lower end that are spaced apart in the second direction, and a second gap at the other one of the two opposite sides,
   the first gap is provided between the principal surface and the terrace part,
   the second gap is provided between the principal surface and an upward portion of the dividing wall that extends upward from the terrace part in a direction orthogonal to the principal surface,
   the upward portion of the dividing wall is provided within the second gap in a plan view, and
   a part of the second electronic component is positioned in the second gap between the upward portion of the dividing wall and the principal surface.

7. The semiconductor device manufacturing method according to claim 6, wherein:
   a ratio of a bonding area of the wire with the bonding part to a load applied when the wire is bonded to the bonding part is more than or equal to 0.00025 mm$^2$/g.

8. The semiconductor device according to claim 1, wherein:

the second electronic component is not connected to the dividing wall by a wire.

* * * * *